(12) United States Patent
Xu et al.

(10) Patent No.: US 7,642,168 B1
(45) Date of Patent: Jan. 5, 2010

(54) SYSTEM AND METHOD FOR PROVIDING A SELF ALIGNED BIPOLAR TRANSISTOR USING A SACRIFICIAL POLYSILICON EXTERNAL BASE

(75) Inventors: Mingwei Xu, South Portland, ME (US); Steven J. Adler, Cape Elizabeth, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 255 days.

(21) Appl. No.: 11/804,597

(22) Filed: May 18, 2007

(51) Int. Cl.
*H01L 21/331* (2006.01)

(52) U.S. Cl. .......................... 438/364; 438/365; 438/202

(58) Field of Classification Search .................. 438/202, 438/203, 204, 364, 365, 366, 367
See application file for complete search history.

(56) References Cited

U.S. PATENT DOCUMENTS

| 6,043,554 | A | 3/2000 | Miwa |
| 6,559,020 | B1 * | 5/2003 | Salmi .......................... 438/312 |
| 6,740,552 | B2 * | 5/2004 | Gonzalez et al. ............. 438/237 |
| 6,780,695 | B1 * | 8/2004 | Chen et al. ................... 438/202 |
| 7,018,778 | B1 | 3/2006 | Leibiger et al. |
| 7,494,887 | B1 * | 2/2009 | Hussain ....................... 438/309 |
| 2001/0017399 | A1 | 8/2001 | Oda et al. |
| 2003/0045066 | A1 | 3/2003 | Igarashi |
| 2005/0142787 | A1 | 6/2005 | Ko |
| 2005/0184359 | A1 | 8/2005 | Akatsu et al. |
| 2006/0054595 | A1 | 3/2006 | Starzynski |
| 2007/0001264 | A1 | 1/2007 | Sheridan et al. |

OTHER PUBLICATIONS

S. Harrison, et al., "Poly-gate Replacement Through Contact Hole (PRETCH): A new method for High-K/Metal gate and multi-oxide implementation on chip," IEEE 2004, pp. 12.2.1-12.2.4.
P. Chevalier, et al., "230 GHz self-aligned SiGeC HBT for 90 nm BiCMOS technology", 2004 IEEE, pp. 225-228.

* cited by examiner

*Primary Examiner*—Kevin M Picardat (57) ABSTRACT

A system and method are disclosed for providing a self aligned bipolar transistor using a sacrificial polysilicon external base. An active region of a transistor is formed and a sacrificial polysilicon external base is formed above the active region of the transistor and covered with a silicon oxide layer. Then an emitter window is etched and filled with silicon nitride. An etch procedure is subsequently performed to remove the sacrificial polysilicon external base. A layer of doped polysilicon material is then deposited to fill a cavity within the transistor formed by the removal of the sacrificial polysilicon external base. A polysilicon emitter structure is subsequently formed in the emitter window. The self aligned bipolar transistor architecture of the invention is compatible with BiCMOS technology.

20 Claims, 7 Drawing Sheets

SYSTEM AND METHOD FOR PROVIDING A SELF ALIGNED BIPOLAR TRANSISTOR USING A SACRIFICIAL POLYSILICON EXTERNAL BASE

TECHNICAL FIELD OF THE INVENTION

The system and method of the present invention is generally directed to the manufacture of integrated circuits and, in particular, to a system and method for providing a self aligned bipolar transistor using a sacrificial polysilicon external base.

BACKGROUND OF THE INVENTION

Self aligned architectures in bipolar transistors are advantageous is that they provide better window downscaling and lower levels of parasitic capacitances and parasitic resistances. One commonly used prior art method of manufacturing self aligned bipolar transistors involves the use of a sacrificial nitride emitter and a raised external base.

Complex process steps are often required to form a self aligned bipolar transistor that has a sacrificial nitride emitter and a raised external base. Such complex process steps include selective epitaxial (EPI) growth and chemical mechanical polishing (CMP) procedures. These complex process steps increase the cost and processing time required to manufacture this type of self aligned bipolar transistors.

Therefore, there is a need in the art for a system and method that is capable of solving the problems that occur when such prior art methods are utilized. In particular, there is a need in the art for a system and method for providing an efficient process that is capable of manufacturing a self aligned bipolar transistor.

The method of the present invention solves the problems that are associated with the prior art by providing a self aligned bipolar transistor using a sacrificial polysilicon external base. An active region of a transistor is formed and a sacrificial polysilicon external base is formed above the active region of the transistor and covered with a silicon oxide layer. Then an emitter window is etched and filled with silicon nitride. An etch procedure is subsequently performed to remove the sacrificial polysilicon external base. Then a layer of doped polysilicon material is deposited to fill a cavity within the transistor formed by the removal of the sacrificial polysilicon external base. A polysilicon emitter structure is subsequently formed in the emitter window. The self aligned bipolar transistor architecture of the invention is compatible with BiCMOS technology.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 17, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged integrated circuit device.

FIGS. 1 through 16 illustrate successive steps in the formation of an advantageous embodiment of a self aligned bipolar transistor of the present invention using a sacrificial polysilicon external base. To simplify the drawings the reference numerals from previous drawings will sometimes not be repeated for structures that have already been identified. For purposes of clarity of illustration the thickness of the structures will sometimes not be drawn to scale.

Figure 1:
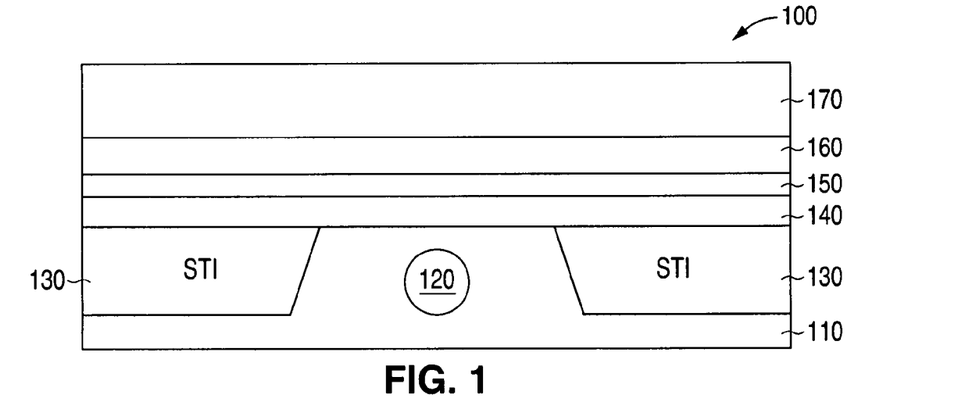
FIGS. 1 through 16 illustrate successive steps in the formation of an advantageous embodiment of a self aligned bipolar transistor of the present invention using a sacrificial polysilicon external base.
Figure 2:
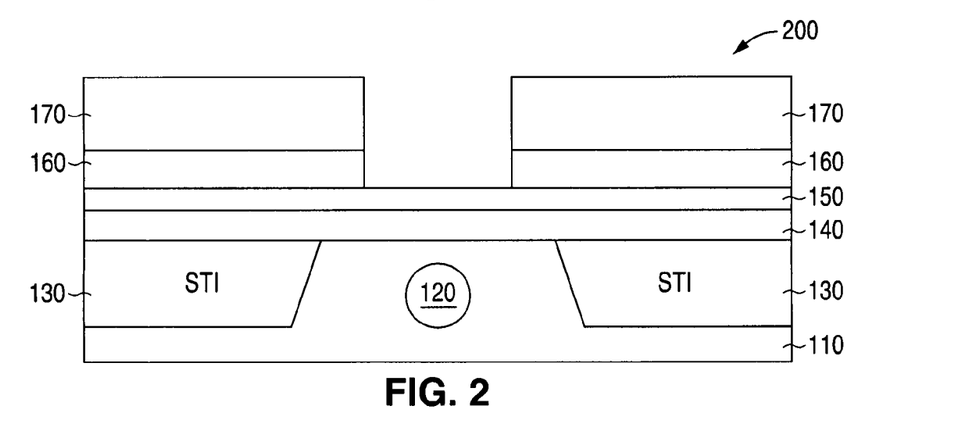
Figure 3:
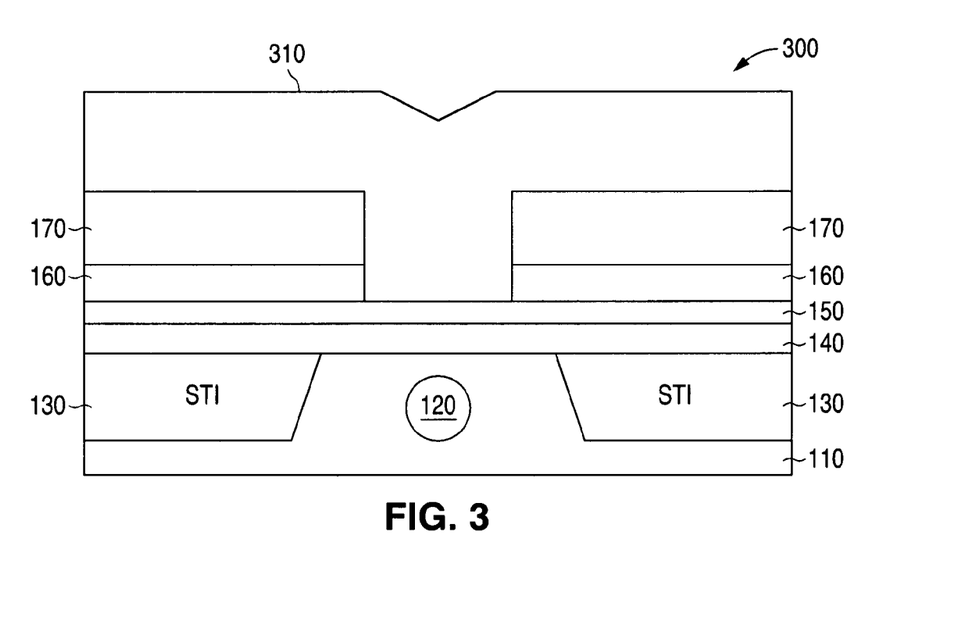
Figure 4:
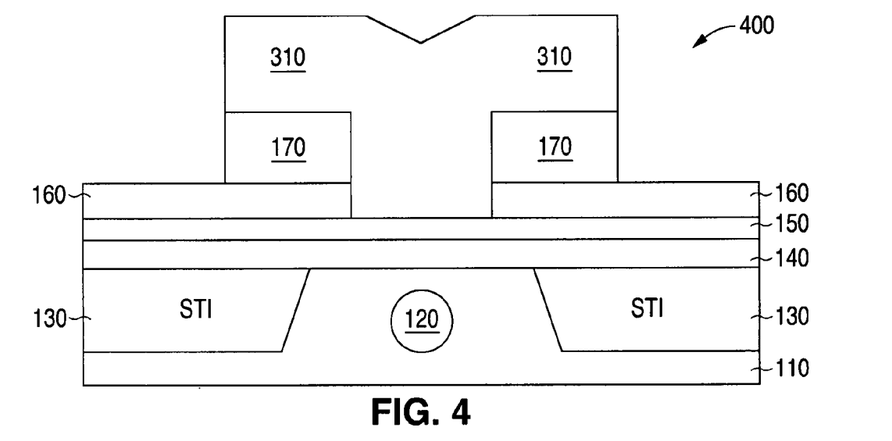
Figure 5:
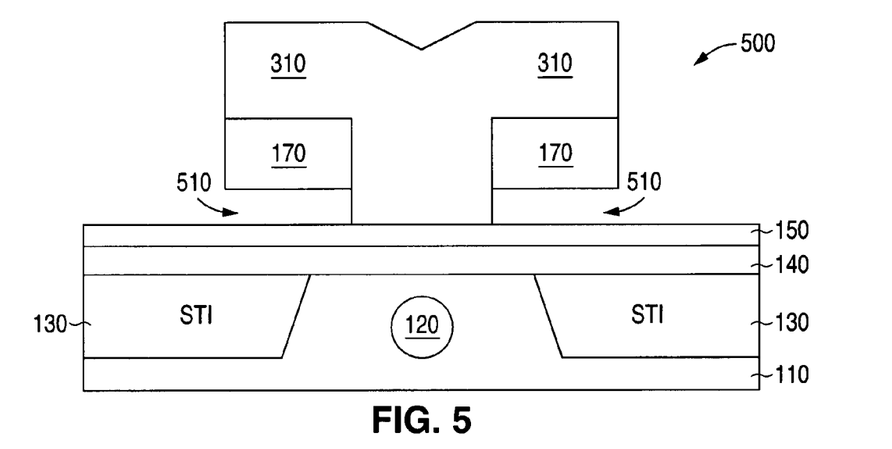

The structure 100 shown in FIG. 1 comprises a Non-Selective Epitaxial Growth (NSEG) collector 110 and a selective implanted collector (SIC) 120 located within a central portion of the NSEG collector 110. The central portion of the NSEG collector 110 is located between two shallow trench isolation (STI) structures 130. As shown in FIG. 1, a layer of Non-Selective Epitaxial Growth (NSEG) base material 140 is placed over the NSEG collector 110 and over the STI structures 130.

Then a layer of silicon oxide material 150 (e.g., tetraethyloxysilane 150) is placed over the NSEG base material 140. In one advantageous embodiment of the invention, the silicon oxide material 150 comprises a layer of silicon oxide that is approximately twenty nanometers (20 nm) thick. Then a layer of polysilicon material 160 is placed over the silicon oxide material 150 to form a sacrificial polysilicon external base. In one advantageous embodiment of the invention, the layer of polysilicon material 160 is approximately sixty nanometers (60 nm) thick.

Then a layer of high density plasma (HDP) oxide material 170 is placed over the layer of polysilicon material 160. In one advantageous embodiment of the invention, the HDP oxide material 170 comprises a layer of HDP oxide that is approximately one hundred nanometers (100 nm) thick. The result of performing these steps is shown in the structure 100 shown in FIG. 1.

Then a mask (not shown) is used to mask the non-central portions of the structure 100. Then a mask and etch procedure is applied to etch away central portions of the HDP oxide material 170 and to etch away central portions of the polysilicon material 160. The etch process stops on the silicon oxide material 150. The result of performing these steps is shown in the structure 200 shown in FIG. 2.

Then a layer of silicon nitride material 310 is deposited over the structure 200. In one advantageous embodiment of the invention, the silicon nitride material 310 comprises a layer of silicon nitride that is approximately one hundred fifty nanometers (150 nm) thick. The silicon nitride material 310 fills in the aperture that has been etched in the central portion of the HDP oxide material 170 and the polysilicon material 160. The result of performing this step is shown in the structure 300 shown in FIG. 3.

Then an external base mask (not shown) is used to mask the central portions of the structure 300. Then a mask and etch procedure is applied to etch away non-central portions of the silicon nitride material 310 and to etch away the underlying non-central portions of the HDP oxide material 170. The etch procedure stops on the layer of polysilicon material 160. The result of performing this step is shown in the structure 400 shown in FIG. 4.

Then an isotropic selective polysilicon etch procedure is applied to remove the sacrificial polysilicon external base material 160. The removal of the sacrificial polysilicon external base material 160 leaves an open space 510 between the HDP oxide material 170 that was above the sacrificial polysilicon external base material 160 and the silicon oxide material 150 that was below the sacrificial polysilicon external base material 160. The result of performing the isotropic selective polysilicon etch procedure is shown in the structure 500 shown in FIG. 5.

Then a diluted hydrofluoric acid (HF) etch procedure is applied to etch away those portions of the silicon oxide material 150 that are not located under the silicon nitride material 310. This diluted hydrofluoric acid (HF) etch procedure removes the silicon oxide material 150 from the external base region. The etch procedure also etches away at most ten nanometers (10 nm) of the HDP oxide material 170. The etch procedure also leaves an open space 610 between the HDP oxide material 170 that was above the sacrificial polysilicon external base material 160 and the NSEG base material 140 that was below the silicon oxide material 150. The result of performing the diluted hydrofluoric acid (HF) etch procedure is shown in the structure 600 shown in FIG. 6.

Figure 6:
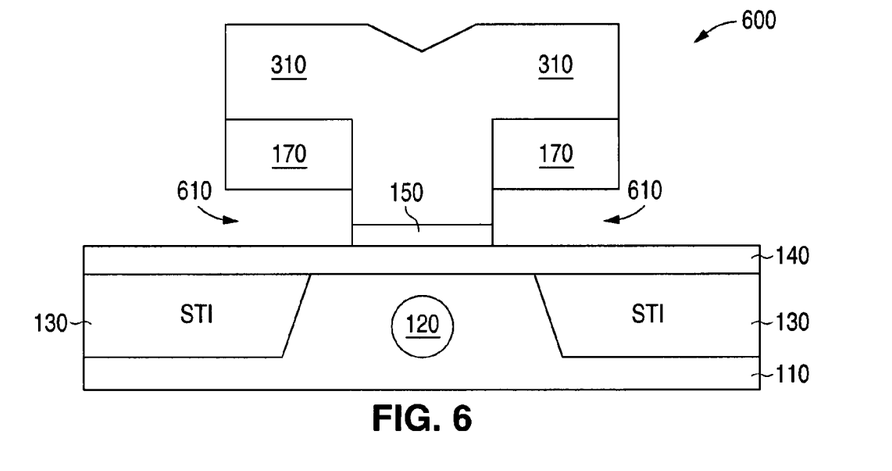
Figure 7:
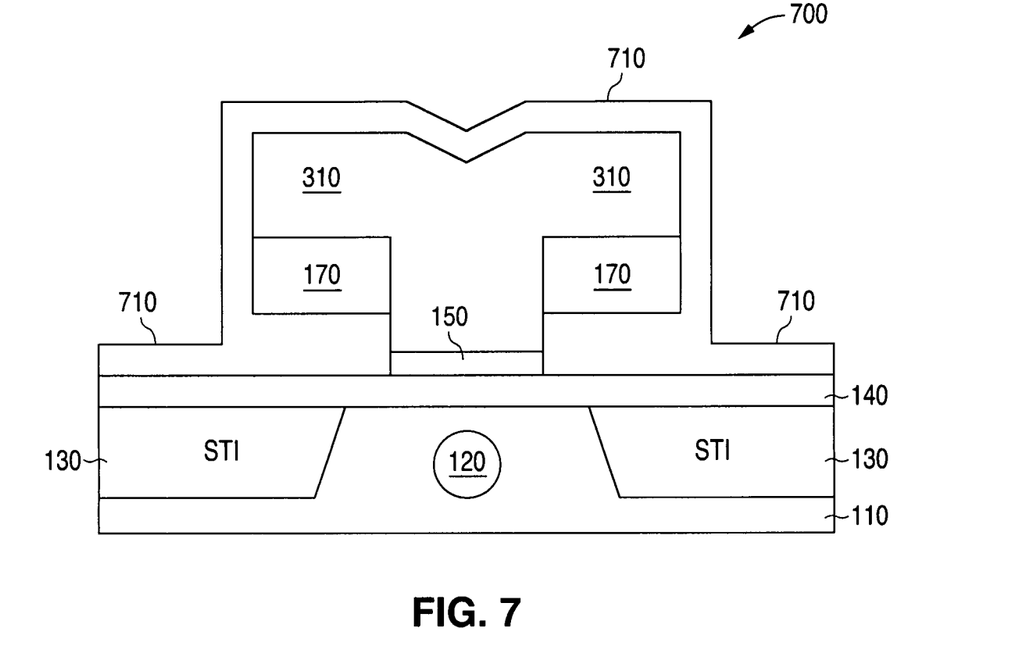
Figure 8:
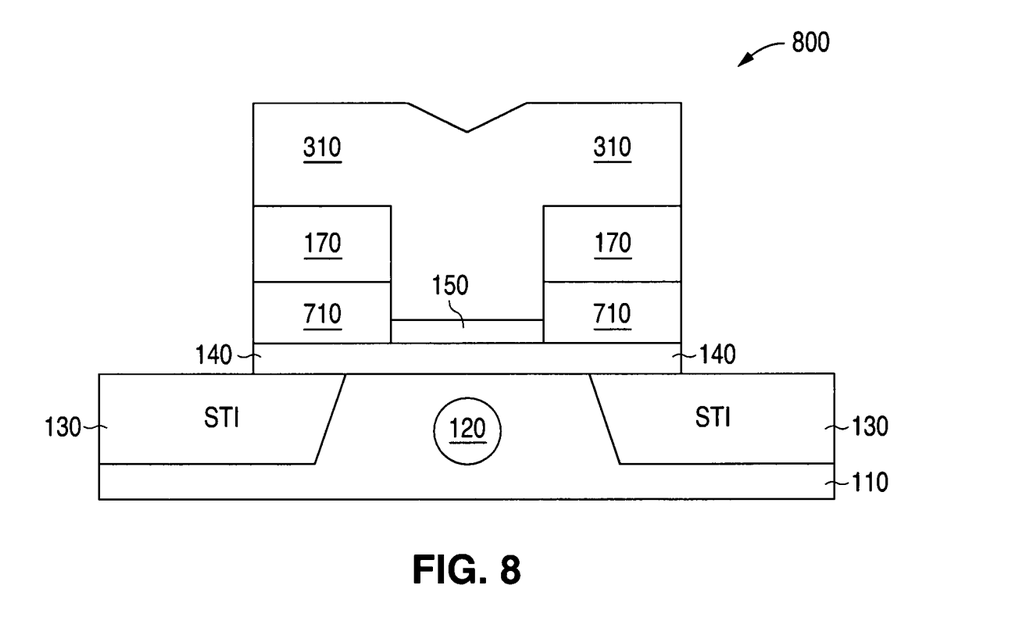
Figure 9:
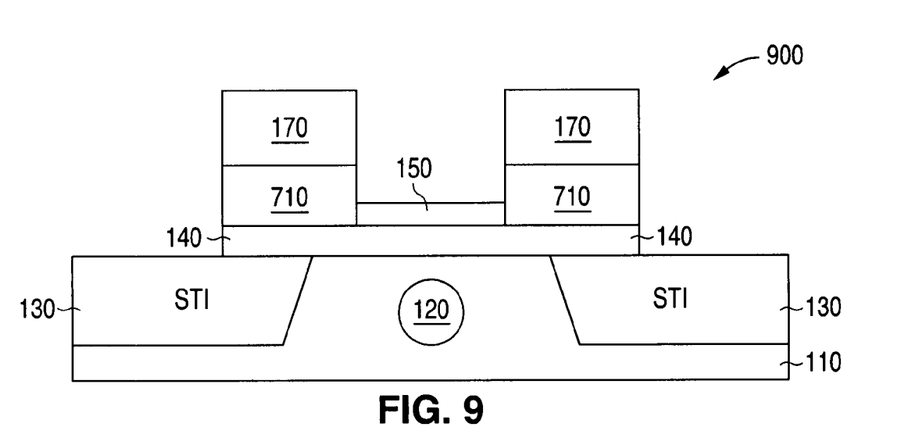
Figure 10:
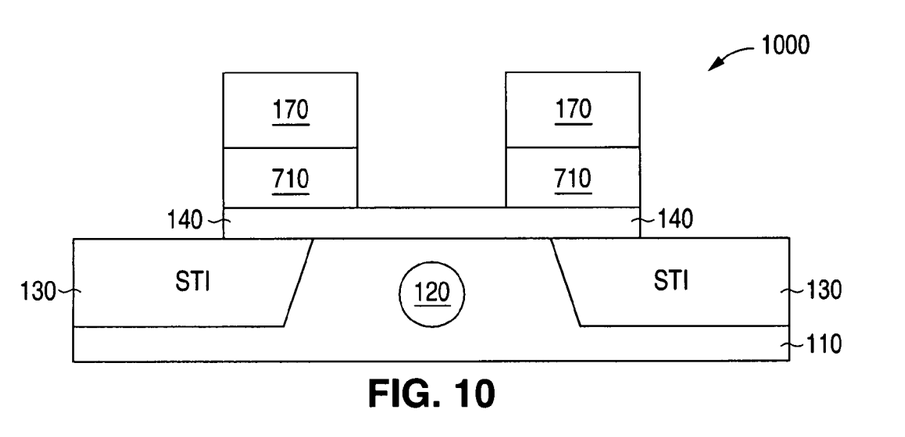
Figure 11:
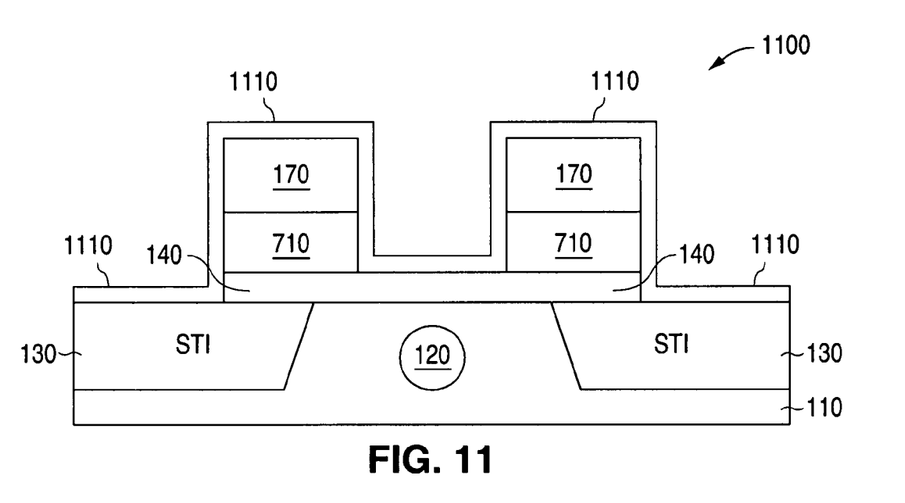
Figure 12:
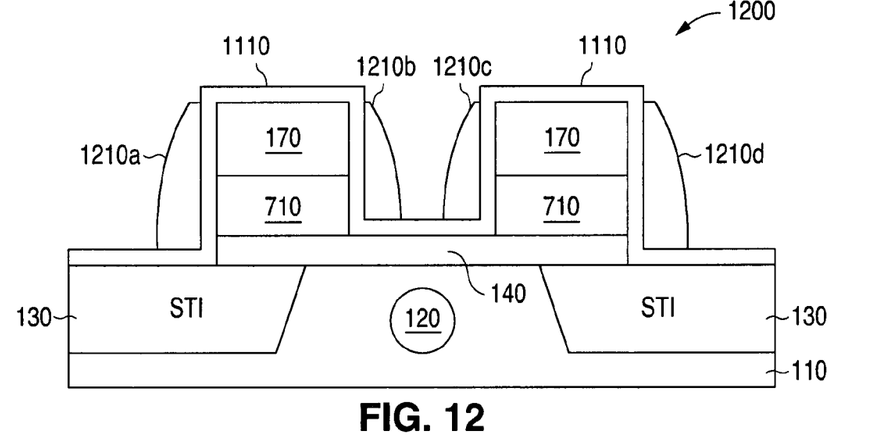
Figure 13:
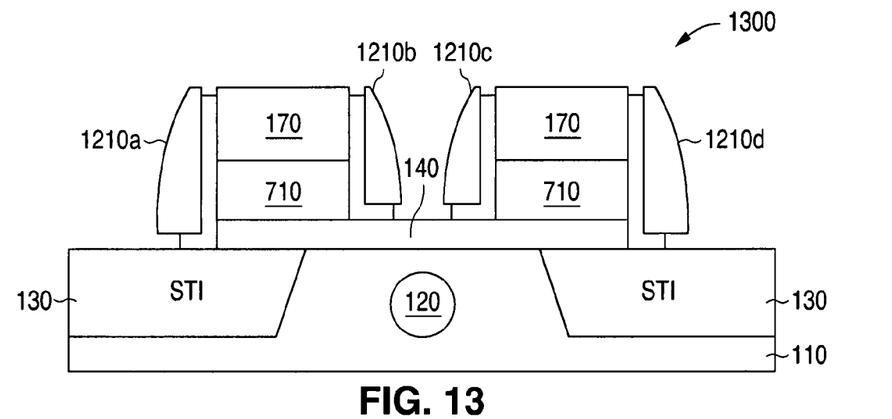
Figure 14:
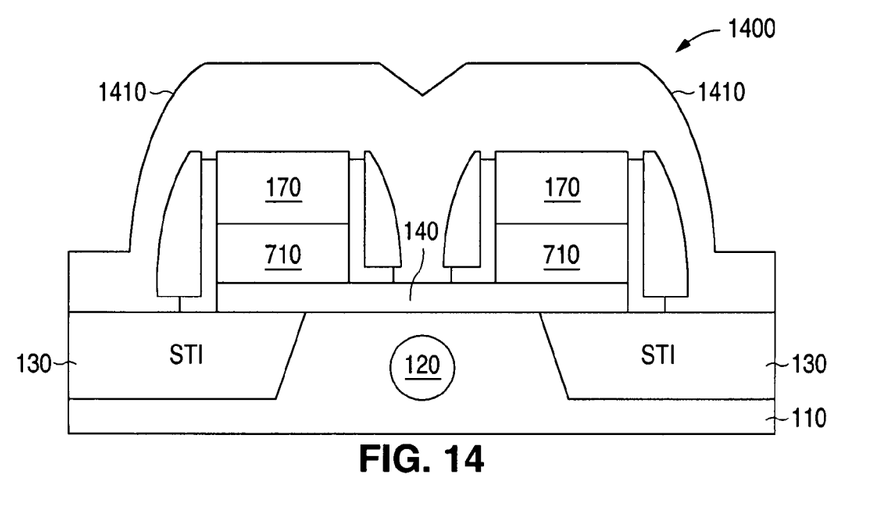
Figure 15:
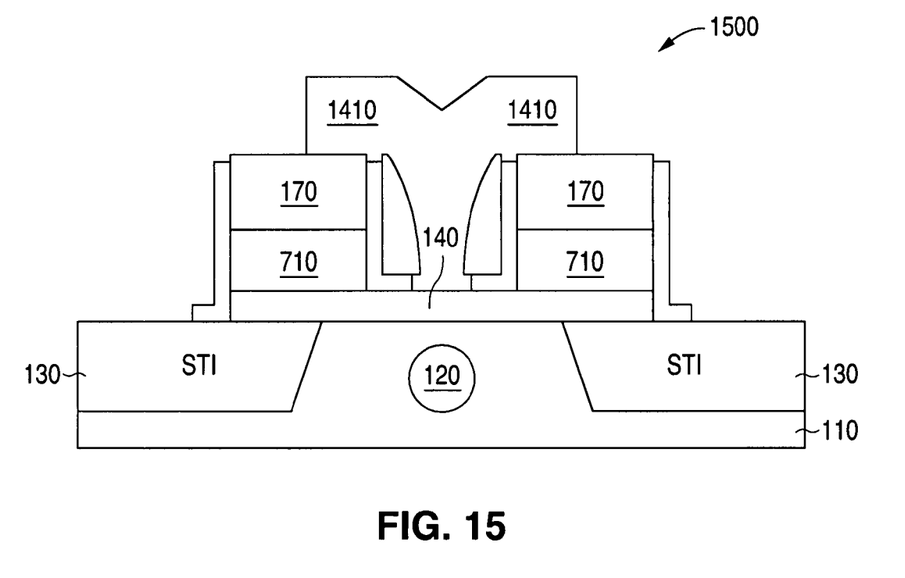

In the next step of the method a layer of in-situ doped polysilicon 710 is deposited over the structure 600 that is shown in FIG. 6. The thickness of the doped polysilicon layer 710 that is used is adjustable to optimize the method for appropriate fill properties. The doped polysilicon layer 710 completely covers the silicon nitride material 310 and the exposed portions of the NSEG base material 140. The doped polysilicon layer 710 also fills in the open space 610 between the HDP oxide material 170 and the NSEG base material 140. The result of the step of depositing the polysilicon layer 710 is shown in the structure 700 shown in FIG. 7.

Then an unmasked etch procedure is applied to etch away the external portions of the polysilicon layer 710 (i.e., those portions of polysilicon layer 710 that are not under the silicon nitride 310) and to etch away the external non-central portions of the NSEG base material 140 (i.e., those portions of the NSEG base material 140 that are not under the HDP oxide material 710). The etch procedure stops on the silicon nitride material 310 and on the shallow trench isolation (STI) structures 130. After the etch procedure the only remaining portions of the polysilicon layer 710 are those portions that are located between the HDP oxide material 170 and the NSEG base material 140. The result of the step of etching away the exposed portions of the polysilicon layer 710 and the exposed portions of the NSEG base material 140 is shown in the structure 800 shown in FIG. 8.

Then an etch procedure is applied to etch away the silicon nitride material 310 and to expose the silicon oxide material 150 at the bottom of the emitter window. The etch procedure stops on the HDP oxide material 170 and on the silicon oxide material 150 at the bottom of the emitter window. The result of the step of etching away the silicon nitride material 310 to expose the silicon oxide material 150 at the bottom of the emitter window is shown in the structure 900 shown in FIG. 9.

Then a diluted hydrofluoric acid (HF) etch procedure is applied to etch away the silicon oxide material 150 at the bottom of the emitter window. The diluted hydrofluoric acid (HF) etch procedure also etches away at most ten nanometers (10 nm) of the HDP oxide material 170. The diluted hydrofluoric acid (HF) etch procedure stops on the NSEG base material 140 at the bottom of the emitter window. The result of the step of etching away the silicon oxide material 150 at the bottom of the emitter window is shown in the structure 1000 shown in FIG. 10.

Then an oxide layer 1110 (e.g., tetraethyloxysilane 1110) is deposited over the structure 1000. In one advantageous embodiment the thickness of the oxide layer 1110 is approximately twenty nanometers (20 nm). The oxide layer 1110 covers the exposed portions of the HDP oxide material 170 and the exposed portions of the NSEG base material 140 at the bottom of the emitter window and the exposed portions of the shallow trench isolation (STI) structures 130. The result of the step of depositing the oxide layer 1110 is shown in the structure 1100 shown in FIG. 11.

Then a layer of amorphous silicon 1210 (a-silicon 1210) is deposited over the oxide layer 1110 of structure 1100. Then an unmasked dry etch procedure is performed to etch the amorphous silicon layer 1210 to form amorphous silicon spacers. The result of the step of depositing the amorphous silicon layer 1210 and then etching the amorphous silicon layer 1210 to form four amorphous silicon spacers (1210a, 1210b, 1210c, 1210d) is shown in the structure 1200 shown in FIG. 12.

Then a diluted hydrofluoric acid (HF) etch process is applied to etch away certain portions of the oxide layer 1110. The etch process is applied to remove portions of the oxide layer 1110 in the emitter window to expose the underlying NSEG base material 140. The etch process is also applied to remove lateral portions of the oxide layer 1110 that cover the shallow trench isolation (STI) structures 130. The result of applying the etch process to remove the portions of the oxide layer 1110 is shown in the structure 1300 shown in FIG. 13. There may be a small amount of oxide layer 1110 that is removed from under the outer edge of the amorphous silicon spacers 1210a, 1210b, 1210c and 1210d.

Then an in-situ doped polysilicon layer 1410 is deposited over the structure 1300. In one advantageous embodiment of the invention the thickness of the doped polysilicon layer 1410 is approximately one hundred nanometers (100 nm). The result of depositing the doped polysilicon layer 1410 is shown in the structure 1400 shown in FIG. 14.

A first polyemitter etch procedure is then performed. A polyemitter mask (not shown) is applied to cover the central portions of the structure 1410. The first polyemitter etch procedure removes portions of the doped polysilicon layer 1410 that are not located under the polyemitter mask. The first polyemitter etch procedure also removes the amorphous silicon spacer 1210a and the amorphous silicon spacer 1210d. The first polyemitter etch procedure stops on the HDP oxide layer 170 and on the shallow trench isolation (STI) structures 130. The result of applying the first polyemitter etch procedure is shown in the structure 1500 shown in FIG. 15.

Figure 16:
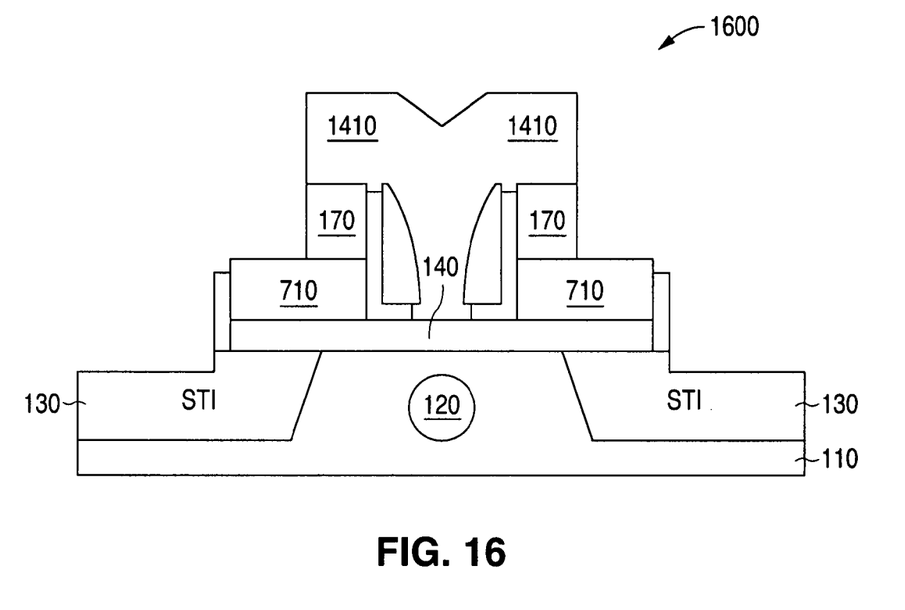

A second polyemitter etch procedure is then performed. The same polyemitter mask (not shown) that was used in the first polyemitter etch procedure is used. The second polyemitter etch procedure removes lateral portions of oxide layer 1110 that are not located under the polyemitter mask. As shown in FIG. 16, the second polyemitter etch procedure also removes portions of the HDP oxide material 170 that are not under the polyemitter mask. The second polyemitter etch procedure stops on the polysilicon layer 710. The second polyemitter etch procedure also removes a portion of the top surface of the shallow trench isolation (STI) structures 130. The result of applying the second polyemitter etch procedure is shown in the structure 1600 shown in FIG. 16.

The structure 1600 shown in FIG. 16 represents a self aligned architecture for a bipolar transistor that has been manufactured by using a sacrificial polysilicon external base without using costly and time consuming complex process steps (e.g., Chemical Mechanical Polishing (CMP), selective epitaxial growth). The present invention provides an efficient method for creating a raised external base without using selective epitaxial (EPI) growth. The raised external base is formed simultaneously with the self aligned emitter-base structure. The method of the present invention significantly reduces process complexity and improves the compatibility of self aligned bipolar transistor architecture with BiCMOS technology.

Figure 17:
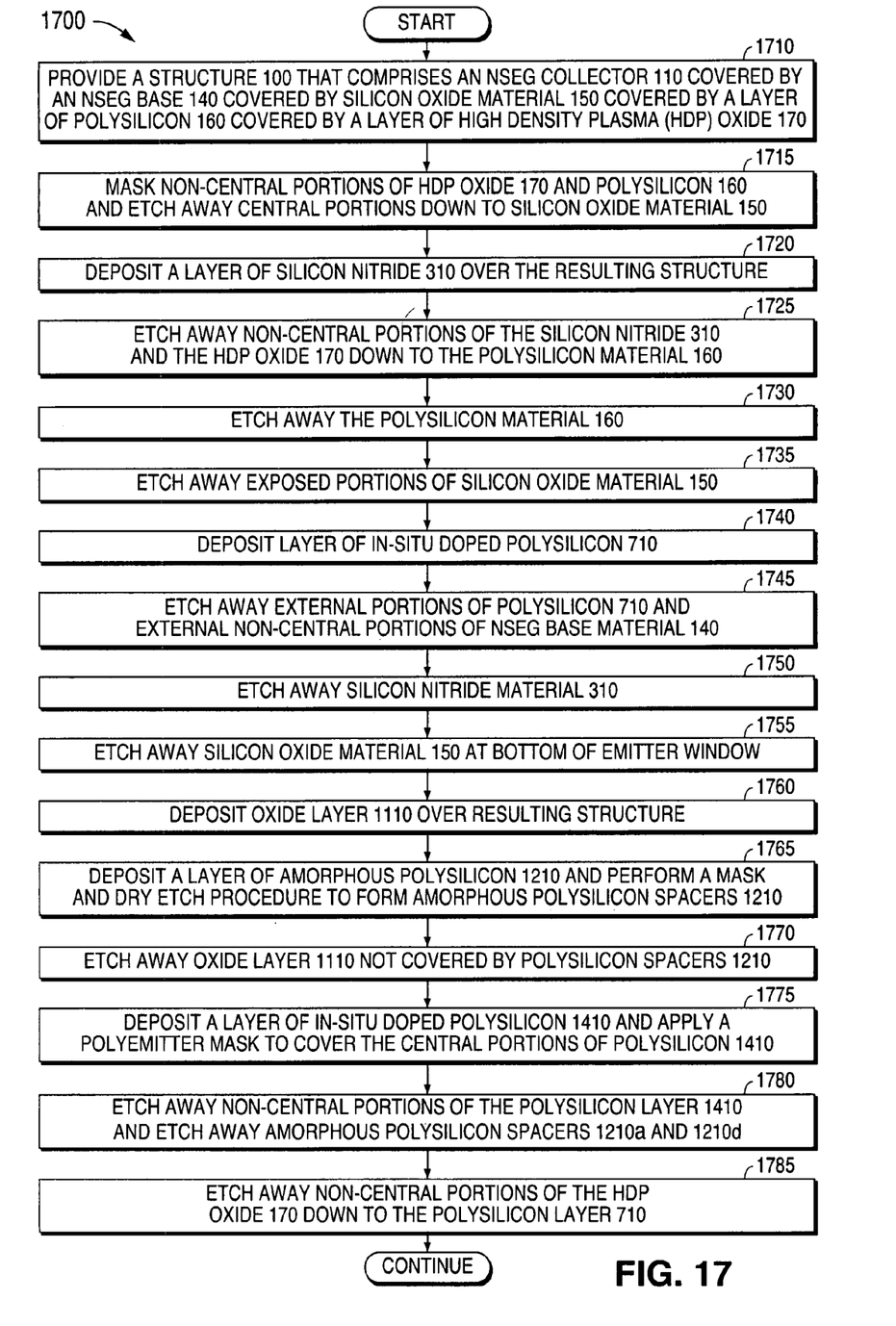
FIG. 17 illustrates a flow chart showing the steps of an advantageous embodiment of a method of the present invention.

FIG. 17 illustrates a flow chart 1700 showing the steps of an advantageous embodiment of a method of the present invention. In the first step of the method a structure 100 is provided that comprises an NSEG collector 110 covered by an NSEG base 140 covered by silicon oxide material 150 covered by a layer of polysilicon material 160 covered by a layer of high density plasma (HDP) oxide material 170 (step 1710). Then the non-central portions of the HPD oxide material 170 and the polysilicon material 160 are masked and the central portions not under the mask are etched away down to the silicon oxide material 150 (step 1715).

Then a layer of silicon nitride material 310 is deposited over the structure 200 (step 1720). Then a mask and etch procedure is applied to etch away non-central portions of the silicon nitride material 310 and the HDP oxide material 170 down to the polysilicon material 160 (step 1725). Then an isotropic selective polysilicon etch procedure is applied to remove the polysilicon material 160 that forms the sacrificial polysilicon external base (step 1730).

Then a diluted hydrofluoric acid (HF) etch procedure is applied to etch away those portions of the silicon oxide material 150 that are not located under the silicon nitride material 310 (step 1735). Then a layer of in-situ doped polysilicon 710 is deposited over the structure 600 (step 1740). Then an unmasked etch procedure is applied to etch away the external portions of the polysilicon layer 710 and the external non-central portions of the NSEG base material 140 (step 1745).

Then an etch procedure is applied to etch away the silicon nitride material 310 and expose the silicon oxide material 150 at the bottom of the emitter window (step 1750). Then an etch procedure is applied to etch away the silicon oxide material 150 at the bottom of the emitter window (step 1755). Then an oxide layer 1110 is deposited over the structure 1000 (step 1760). Then a layer of amorphous polysilicon 1210 is deposited over the oxide layer 1110 and an unmasked dry etch procedure is performed to etch the amorphous polysilicon layer 1210 to form four amorphous silicon spacers (1210a, 1210b, 1210b, 1210d) (step 1765).

Then portions of the oxide layer 1110 that are not covered by the amorphous silicon spacers 1210 are etched away to expose the underlying NSEG base 340 at the bottom of the emitter window (step 1770). Then an in-situ doped polysilicon layer 1410 is deposited over the structure 1300 and a polyemitter mask (not shown) is applied to mask the central portions of the polysilicon layer 1410 (step 1775).

Then portions of the polysilicon layer 1410 that are not under the polyemitter mask are etched away and the amorphous silicon spacers 1210a and 1210d are etched away (step 1780). Then portions of the HDP oxide material 170 that are not under the polyemitter mask are etched away down to the polysilicon layer 710 (step 1785).

The system and method of the present invention provides several significant advantages. The present invention removes the need to perform a Chemical Mechanical Polishing (CMP) procedure to planarize the topology of a sacrificial nitride emitter. This solves the prior art problem of compatibility with BiCMOS technology. The present invention also removes the need to perform a selective epitaxial growth step to form a raised external base.

The system and method of the present invention provides a simple process that provides a non-selective growth EPI base, no CMP procedure for a sacrificial nitride emitter, no selective epitaxial growth for a raised external base and no external base implant. The system and method of the present invention provides an efficient self aligned emitter-base structure that has low levels of parasitic capacitances and parasitic resistances. The system and method of the present invention also provides a high level of radio frequency (RF) performance.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A method of manufacturing a self aligned bipolar transistor comprising the steps of:
    forming an active region of the transistor;
    forming a sacrificial polysilicon external base above the active region of the transistor;
    forming a layer of oxide over the sacrificial polysilicon external base;
    removing the sacrificial polysilicon external base; and
    depositing doped polysilicon material in a cavity within the transistor formed by the removal of the sacrificial polysilicon external base.

2. The method as claimed in claim 1 wherein a thickness of the sacrificial polysilicon external base is approximately sixty nanometers.

3. The method as claimed in claim 1 wherein the cavity comprises an open space between the layer of oxide and the active region of the transistor.

4. The method as claimed in claim 1 wherein the layer of oxide comprises a layer of high density plasma oxide.

5. The method as claimed in claim 4 wherein a thickness of the high density plasma oxide is approximately one hundred nanometers.

6. The method as claimed in claim 5 wherein the step of removing the sacrificial polysilicon external base comprises the step of:
   etching the sacrificial polysilicon external base with an isotropic selective polysilicon etch procedure.

7. A method of manufacturing a self aligned bipolar transistor comprising the steps of:
   forming an active region of the transistor, wherein the active region comprises a collector portion covered by a base portion covered by a silicon oxide material;
   forming a sacrificial polysilicon external base layer on the silicon oxide material;
   forming an oxide layer on the sacrificial polysilicon external base layer;
   removing central portions of the oxide layer and the sacrificial polysilicon external base layer over the active region of the transistor down to the silicon oxide material; and
   depositing a silicon nitride layer over the oxide layer and over the silicon oxide material.

8. The method as claimed in claim 7 further comprising the steps of:
   removing portions of the silicon oxide material that are not covered by the silicon nitride layer down to the base portion of the transistor;
   depositing a first doped polysilicon material over the silicon nitride layer and over the base portion of the transistor; and
   filling a cavity within the transistor formed by the removal of the sacrificial polysilicon external base layer with the first doped polysilicon material.

9. The method as claimed in claim 7 further comprising the steps of:
   removing non-central portions of the silicon nitride layer and the oxide layer down to the sacrificial polysilicon external base layer; and
   removing the sacrificial polysilicon external base layer.

10. The method as claimed in claim 9 wherein the cavity comprises an open space between the oxide layer and the base portion of the active region.

11. The method as claimed in claim 10 further comprising the steps of:
    removing portions of the first doped polysilicon material not under the silicon nitride layer and to removing portions of the base portion of the transistor not under the silicon nitride layer;
    removing the silicon nitride layer;
    removing the silicon oxide material above the base portion of the transistor to form an emitter window; and
    forming an emitter structure in the emitter window.

12. The method as claimed in claim 11 wherein the step of forming the emitter structure in the emitter window comprises the steps of:
    depositing a second oxide layer over the emitter window;
    depositing a layer of amorphous silicon over the second oxide layer;
    forming amorphous polysilicon spacers in the emitter window on top of the second oxide layer; and
    removing portions of the second oxide layer that are not covered by the amorphous polysilicon spacers to expose an underlying base portion of the transistor.

13. The method as claimed in claim 12 further comprising the steps of:
    depositing a second doped polysilicon material to form a doped polysilicon emitter in the emitter window;
    masking a central portion of the second doped polysilicon material with a polyemitter mask;
    removing portions of the second doped polysilicon material that are not located under the polyemitter mask and removing the amorphous silicon spacers that are not located under the polyemitter mask; and
    remove removing portions of the oxide layer that are not under the polyemitter mask down to the first doped polysilicon material filling the cavity within the transistor.

14. A method of manufacturing a raised external base in a self aligned bipolar transistor comprising the steps of:
    forming an active region of the transistor, wherein the active region comprises a collector portion covered by a base portion covered by a silicon oxide material;
    forming a sacrificial polysilicon external base layer on the silicon oxide material;
    forming an oxide layer on the sacrificial polysilicon external base layer; and
    forming the raised external base using the sacrificial polysilicon external base layer by:
      removing central portions of the oxide layer and the sacrificial polysilicon external base layer over the active region of the transistor down to the silicon oxide material; and
      depositing a silicon nitride layer over the oxide layer and over the silicon oxide material.

15. The method as claimed in claim 14 wherein the cavity comprises an open space between the oxide layer and the base portion of the active region.

16. The method as claimed in claim 14 wherein forming the raised external base further comprises the steps of:
    removing non-central portions of the silicon nitride layer and the oxide layer down to the sacrificial polysilicon external base layer; and
    removing the sacrificial polysilicon external base layer.

17. The method as claimed in claim 16 wherein forming the raised external base further comprises the steps of:
    removing portions of the silicon oxide material that are not covered by the silicon nitride layer down to the base portion of the transistor;
    depositing a first doped polysilicon material over the silicon nitride layer and over the base portion of the transistor; and
    filling a cavity within the transistor formed by the removal of the sacrificial polysilicon external base layer with the first doped polysilicon material.

18. The method as claimed in claim 17 wherein forming the raised external base further comprises the steps of:
    removing portions of the first doped polysilicon material not under the silicon nitride layer and removing portions of the base portion of the transistor not under the silicon nitride layer;
    removing the silicon nitride layer;
    removing the silicon oxide material above the base portion of the transistor to form an emitter window; and
    forming an emitter structure in the emitter window.

19. The method as claimed in claim 18 wherein the step of forming an emitter structure in the emitter window comprises the steps of:
    depositing a second oxide layer over the emitter window;
    depositing a layer of amorphous silicon over the second oxide layer;
    forming amorphous polysilicon spacers in the emitter window on top of the second oxide layer; and removing portions of the second oxide layer that are not covered by the amorphous polysilicon spacers to expose an underlying base portion of the transistor.

20. The method as claimed in claim 19 wherein forming the raised external base further comprises the steps of:

depositing a second doped polysilicon material to form a doped polysilicon emitter in the emitter window;

masking a central portion of the second doped polysilicon material with a polyemitter mask;

removing portions of the second doped polysilicon material that are not located under the polyemitter mask and removing the amorphous silicon spacers that are not located under the polyemitter mask; and removing portions of the oxide layer that are not under the polyemitter mask down to the first doped polysilicon material filling the cavity within the transistor.

\* \* \* \* \*

UNITED STATES PATENT AND TRADEMARK OFFICE
CERTIFICATE OF CORRECTION

| | | |
|---|---|---|
| PATENT NO. | : 7,642,168 B1 | Page 1 of 1 |
| APPLICATION NO. | : 11/804597 | |
| DATED | : January 5, 2010 | |
| INVENTOR(S) | : Mingwei Xu and Steven J. Adler | |

It is certified that error appears in the above-identified patent and that said Letters Patent is hereby corrected as shown below:

Column 7, claim 11, line 47, delete "to" before the term "removing"; and

Column 8, claim 13, line 9, delete "remove".

Signed and Sealed this
Twenty-second Day of February, 2011

David J. Kappos
*Director of the United States Patent and Trademark Office*